United States Patent

Naumann

[11] Patent Number: 5,878,330
[45] Date of Patent: *Mar. 2, 1999

[54] SATELLITE COMMUNICATIONS SYSTEM INCLUDING AUTOMATIC FREQUENCY CONTROL

[75] Inventor: Gerhard Naumann, New York, N.Y.

[73] Assignee: WorldComm Systems, Inc., Hauppaue, N.Y.

[*] Notice: This patent issued on a continued prosecution application filed under 37 CFR 1.53(d), and is subject to the twenty year patent term provisions of 35 U.S.C. 154(a)(2).

[21] Appl. No.: 650,616

[22] Filed: May 20, 1996

[51] Int. Cl.[6] ...................................................... H04B 1/12
[52] U.S. Cl. ...................... 455/71; 455/13.2; 455/67.6; 455/265; 342/402; 342/405; 342/418
[58] Field of Search ........................... 455/71, 13.2, 12.1, 455/258, 260, 265, 182.2, 76, 70, 67.4, 67.6, 504, 257, 517; 342/358, 402, 418, 405; 375/375, 376

[56] References Cited

U.S. PATENT DOCUMENTS 3,450,842  6/1969  Lipke .
4,001,690  1/1977  Mack et al. ................................ 455/71
4,466,130  8/1984  Sewerinson ............................. 455/260
4,479,256  10/1984  Sewerinson ............................. 455/265

Primary Examiner—Wellington Chin
Assistant Examiner—Lee Nguyen
Attorney, Agent, or Firm—Hopgood, Calimafde, Kalil & Judlowe, LLP

[57] ABSTRACT

An automatic frequency control system for use in satellite communications is provided that is pre-programmed with an initial acquisition Doppler offset frequency. The system includes a search mode for accurately determining the satellite's initial frequency translation error before the initiation of data transmission and also for determining the Doppler rate of change. The system further includes a tracking mode, in which the frequency variation is continuously monitored. Depending on the frequency characteristics of the transmission, the system is capable of re-entering the search mode to determine a new frequency translation error, if necessary.

1 Claim, 4 Drawing Sheets

SATELLITE COMMUNICATIONS SYSTEM INCLUDING AUTOMATIC FREQUENCY CONTROL

FIELD OF THE INVENTION

The invention relates generally to a control system used in modern communications environments. More specifically, the invention relates to an automatic frequency control system for use in satellite communications systems.

BACKGROUND OF THE INVENTION

As the global village becomes smaller, and the use of satellite communications grows daily, efforts to push the capacity of satellites and their transmissions presents ever-increasing hurdles. In the area of satellite data communication, in which the high priorities are speed and accuracy, the unique paradigm of space-linked communications has variables that must be compensated for in order to achieve the maximum throughput of error-free data.

With satellites that are not geostationary, a significant variable that affects any satellite transmission system is the Doppler effect. This well known effect occurs when the distance between a transmitter and receiver of signals is changing. In the case of satellite transmissions, the effect manifests itself by shifting signals away from their intended frequency. Normally, all satellites in a particular orbit will have the same Doppler shift when in the same point in the orbit with respect to a point on the Earth. This shift changes with respect to a particular ground station as the satellite moves in its orbit. Both the shift for a given position and the rate of change may be generally calculated and compensated for in any communications system. However, many current satellite communication systems rely on multiple satellites simultaneously to provide necessary relative location information and to determine the Doppler shift.

There are also further variables that may contribute to signal frequency translation. For example, the satellite's internal oscillators may experience drift within (or perhaps even beyond) their tolerance. This drift may constantly or randomly change. In addition, satellite signals often experience further frequency translations caused by temperature. This effect depends upon the time day, as each satellite in a given orbital plane will enter and exit the earth's shadow at different times throughout the day.

These translation errors have made accurate location measurements difficult, if not impossible, when using only one satellite. With large-scale, high-cost systems, the luxury of providing multiple satellite access for location calculations is possible. With expanded satellite use, locating remote users accurately has become more critical due to various technical and economic reasons.

Such translation errors have had minimal impact in the past upon the proper functioning of satellite communications systems. With analog communications, including voice and video relays, slight frequency translations had little effect on the ultimate transmission. The frequency control loops of data modems could deal with a small and constant frequency translation error caused by the satellite's internal local oscillators. However, relatively large constantly varying frequency offsets due to Doppler caused by low orbiting satellites affect digital communications much more severely than in the past. With the advent of digital communications, especially in connection with the global Internet, frequency errors can increase the transmission errors, usually expressed as a bit error rate (BER). Above a certain BER, digital communications become useless. At lower BERs, the systems relying on the satellite link are less efficient, less reliable and more costly. To date, however, no cost-efficient system fully compensates for these frequency translations to a sufficient degree to permit digital satellite communications to achieve their full potential and to reach the largest audience.

SUMMARY OF THE INVENTION

In view of the deficiencies of the prior art, it is an object of the invention to provide a satellite communications system having an automatic frequency control system.

It is a further object of the invention to provide an automatic frequency control system that is able to compensate for Doppler frequency shifts.

It is a still further object of the invention to provide an automatic frequency control system that is able to compensate for satellite oscillator drift.

It is another object of the invention to provide an automatic frequency control system that is capable of continuous monitoring of signal transmission and automatically compensating for frequency translation when necessary.

In accordance with the objects of the invention, an automatic frequency control system is provided that is preprogrammed with an initial acquisition Doppler offset frequency. The system includes a search mode for accurately determining the satellite's initial frequency translation error before the initiation of data transmission and also for determining the Doppler rate of change. The system further includes a tracking mode, in which the frequency variation is continuously monitored. Depending on the frequency characteristics of the transmission, the system is capable of re-entering the search mode to determine a new frequency translation error, if necessary.

BRIEF DESCRIPTION OF THE DRAWINGS

The foregoing and other objects and advantages will become apparent to those skilled in the art upon a reading of the following detailed description of the preferred embodiments, in conjunction with a review of the appended drawings, in which.

DETAILED DESCRIPTION OF THE PREFERRED EMBODIMENTS

Figure 1:
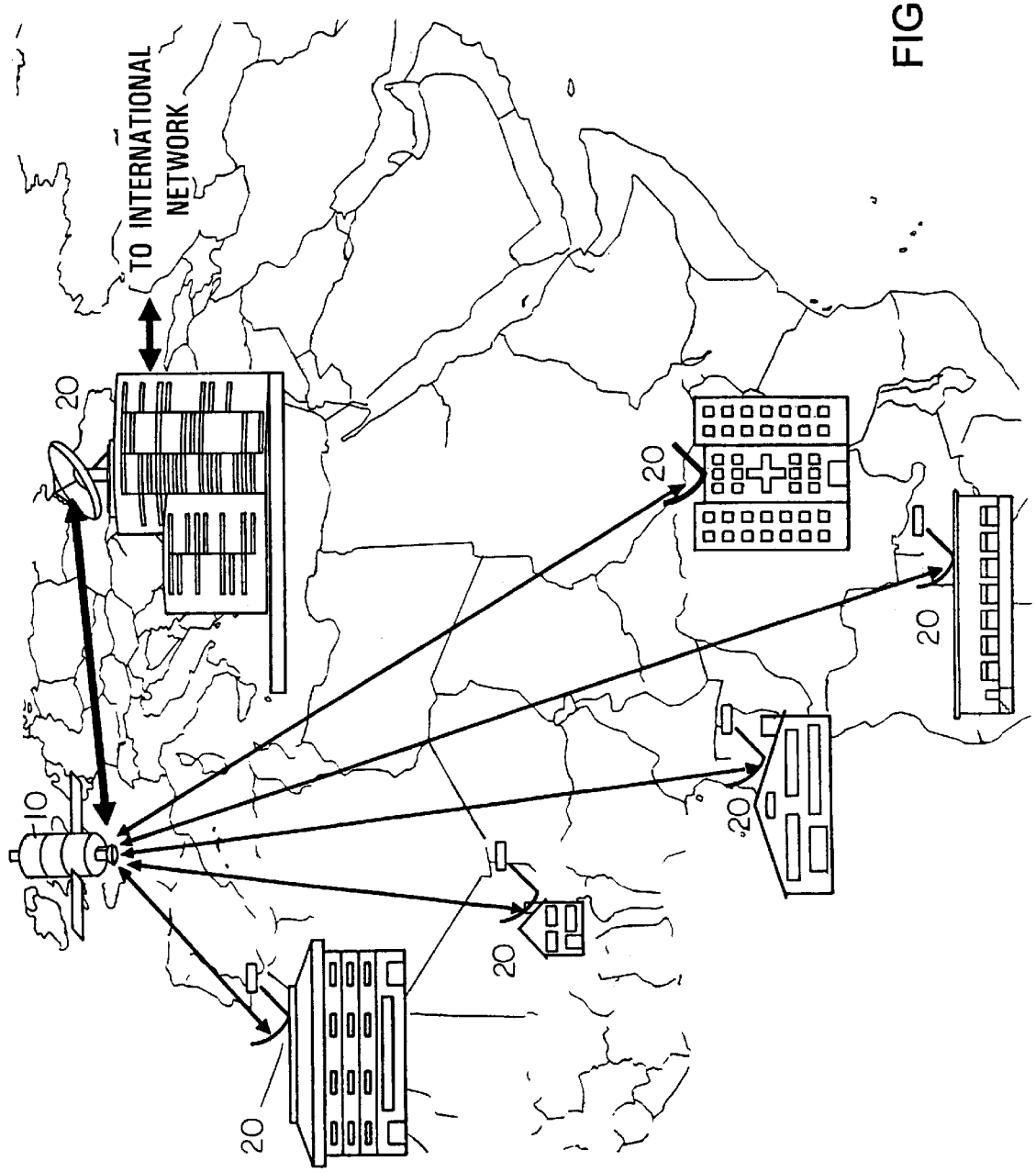
FIG. 1 is an overall schematic diagram of a satellite communications system including an automatic frequency control system of the present invention.
Figure 2:
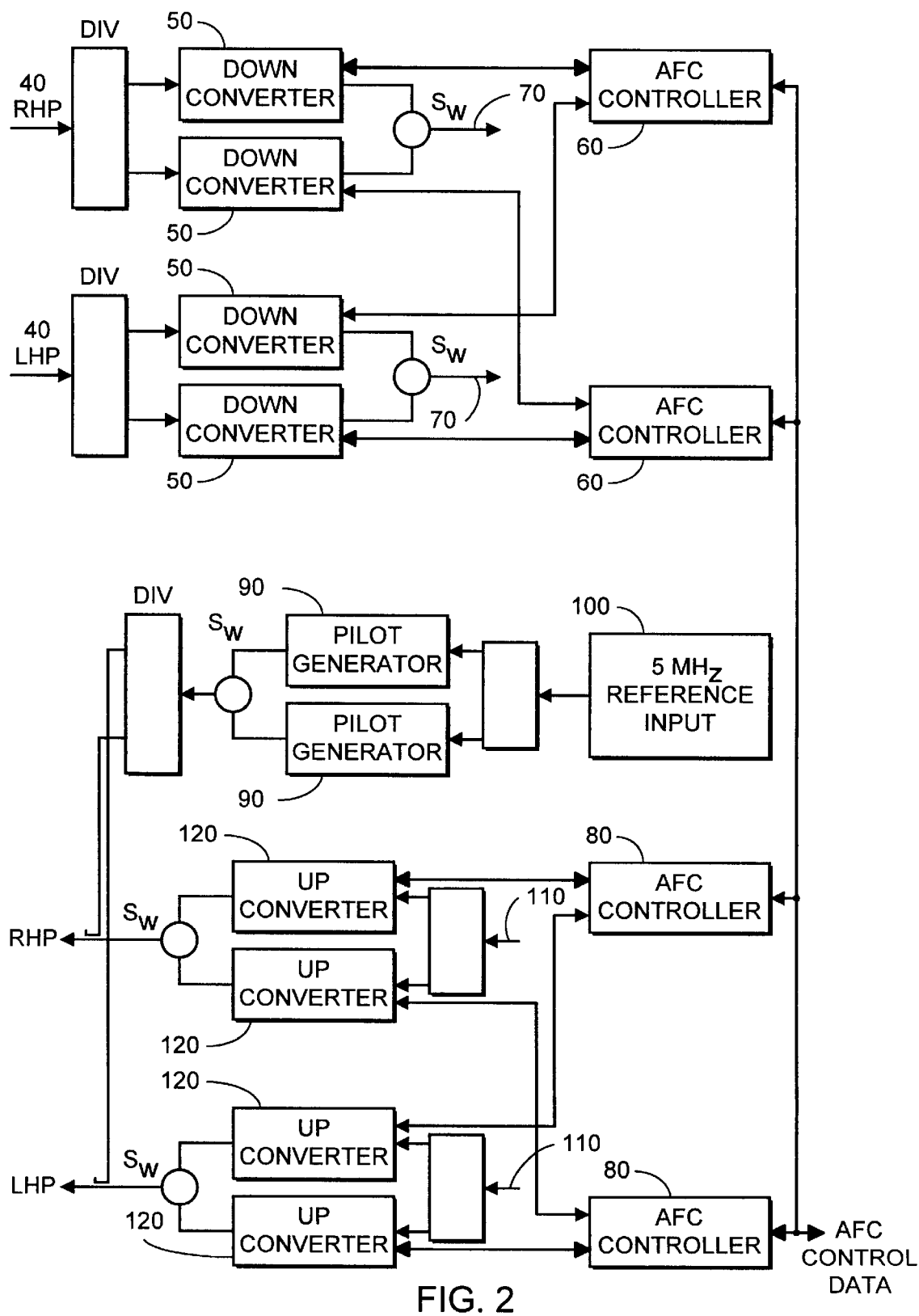
FIG. 2 is a schematic block diagram of a satellite transceiver system including an automatic frequency control system of the present invention.

Referring now to FIG. 1, a representation of a satellite communications system is shown. As an example, the earth-orbiting satellite 10 shown is of the type considered a Medium Orbiting Satellite, with an orbit period of approximately four to more than six hours. As such, it is not a geostationary satellite. Of course, the invention will work with a multitude of satellite types and orbits, as would be apparent to one skilled in the art. In the preferred embodiment, remote user terminals 20 communicate with a hub terminal 30. Any one or more of the user terminals 20 may communicate with the hub terminal 30 through the satellite 10. The communications between the satellite 10 and the hub terminal 30 are preferably in the C-Band, while remote user terminals 20 preferably use the S-Band to communicate with the satellite 10. However, the particular frequency band is unimportant to the present invention. In order for the satellite 10 to communicate most efficiently and accurately with a user terminal 20, it is necessary to locate the user terminal 20 on Earth to within a tolerance of about several hundred meters.

The location may be determined by measuring the Doppler shifted carrier frequency received at the user terminal 20 and the burst timing with a high degree of precision. By measuring just the Doppler shift, the location of the user terminal 20 is only known to be along calculated arcs on the Earth's surface. By timing a round trip for a burst signal between the satellite 10 and the terminal, the distance between the two may be determined, which locates the terminal along a calculated circle below the satellite. However, once both the Doppler shift and distance information are determined, the location, to within the desired tolerance, may be calculated as the intersection of the calculated arcs and circles, as is known by those skilled in the art. The location is preferably calculated within the hub terminal 30 and then used by the hub terminal 30 to control which of the satellite's multiple beams (99 in the preferred embodiment) is used to communicate with the user terminal 20.

The following description will first cover overall operation of a transceiver hub terminal including automatic frequency control ("AFC") components of the present invention, followed by a more detailed description of the AFC circuit components.

The ground station transmission includes two C-Band pilot frequencies described in detail below. The AFC equipment measures the received pilot frequencies via the C to C satellite transponder loop back, and calculates the satellite transponder frequency offset using the differential Doppler information present on the two pilot frequencies. Once this offset is determined, the AFC loop then calculates the required hub terminal frequency converter frequency translation correction required and generates the local oscillator reference frequencies necessary to assure that the hub terminal transmit and receive frequencies referenced to the satellite location have essentially zero frequency error. Thus, any frequency shifts of the received carrier at the hub terminal during communication with a user terminal will be essentially caused by the Doppler frequency shift between the satellite and the user terminal. The Doppler frequency offset and the rate of change of the Doppler frequency information is provided to the hub terminal main processor for use in the user terminal location processing algorithm.

When the hub station is receiving, the return satellite signals preferably include left and right hand down link signals 40 (although polarization is not critical) that are applied to redundant C to L Band down converters 50. These converters 50 translate the dual C to C band pilots down to the L band. The particular frequency bands, however, are unimportant to the present invention. The local oscillator frequencies of the redundant on-line and backup frequency down converters are controlled by separate AFC controllers 60. Each controller 60 can preferably adjust the local oscillator frequency of their respective down converter 50 with a frequency resolution of 1 Hz or less. The AFC corrected IF output spectrum is then applied to an IF interfacility link ("IFL") (at 70), which subsequently is applied to channel units (not shown), which are multiple data (transceiver) modems.

Each AFC controller 60 monitors the received frequencies of the dual C to C Pilots. Frequency error data is fed to an internal processor which in turn derives the satellite frequency translation error, the Doppler frequency offset, and the Doppler frequency rate of change. This data is fed to the down converter AFC controllers 60 for subsequent down converter local oscillator frequency correction. The processor also calculates the required up link frequency correction and programs the up converter AFC controllers 80 at the same time.

The C to C pilot frequency is generated in the hub terminal up-link by redundant pilot frequency generators 90. The C-Band pilot frequency is locked to the hub terminal's redundant high stability 5 MHz reference source 100. The 5 MHz reference 100 is also applied to the frequency converter synthesizers which generate the local oscillator carrier frequencies for the up and down converters in the radio frequency equipment of the hub terminal. Other frequency reference sources, such as a 10 MHz source, may be used similarly.

When the ground station transmits, the transmit channel unit inputs (at 110) are applied to individual redundant left and right hand polarization up converters 120. The AFC corrected local oscillators in the up converters 120 translate the channel unit spectrum to C-Band. Separate AFC controllers 80 control the redundant on-line and off-line up converters 120.

The initial Doppler offset frequency and the satellite Doppler rate of change versus time is not expected to vary between satellites in the same orbital plane. However, the initial satellite frequency translation error is expected to vary with each satellite and depends upon such factors as the temperature due to the satellite's passage through the Earth's shadow, which occurs at different times of the day for each individual satellite.

It is expected that the Doppler rate of change data will be updated within the AFC controllers approximately every second. Since the AFC controller updates the frequency converter synthesizer local oscillator frequency at a rate of 50 to 100 times each second, the updates are frequent enough so that the frequency change per update at the carrier frequency will be 1 Hz or less. A Direct Digital Synthesizer (DDS) sometimes referred to as a Numerically Controlled Oscillator (NCO) is used in the AFC controller. The DDS permits rapid coherent phase fractional frequency changes of the local oscillator frequency avoiding large phase transients to be generated on the carrier which may cause degraded BER performance in the user terminal and hub terminal demodulators.

Whenever the frequency offset or Doppler rate of change data is updated, the AFC controller compares the new update data from the processor with its prior stored data. Any large rate or frequency offset difference will cause an error state in the AFC controller. The triggering difference may be programmable and is preferably within 0.1 to 1.0 percent of the expected Doppler, which varies with time during a satellite pass.

In the event of loss of pilot detection or loss of pilot phase lock, the AFC controller will employ its internally stored data using the last stored satellite frequency error and satellite acquisition frequency offset data as a basis for Doppler and frequency corrections until the pilot is reacquired. Normally, the current on-line converters will be switched offline assuming that the off-line channel unit controller has not failed as well.

Error states are suppressed during the initial AFC controller learning phase until the initial Doppler rate of change and offset are determined and the controller's internal memory is valid. The data is stored in non-volatile memory so that short power outages will not erase its memory. The AFC controller may be reset to erase all internal memory to start the learning process again. Start of frequency correction will be initialized by the AFC controller's internal clock upon command from a local support processor ("LSP"), or against a preprogrammed stored start time in conjunction with an internal clock within the AFC controller.

When requested, the AFC controller will transfer its internal data to the local support processor, including all status and operational configuration information. The LSP maintains the status and controls most of the hub terminal radio frequency equipment, such as redundancy switching, power monitoring and calibration. Separate controllers are used for the frequency converter synthesizer control and the LSP communications control functions so that one will not effect the timely response of the other. watchdog timers, range, and parity checking in the AFC controller provides fault detection for this unit. Communications between the converters and AFC controller is via a high speed asynchronous serial data link. A watchdog timer and parity checking provides fault detection for this link.

Figure 3:
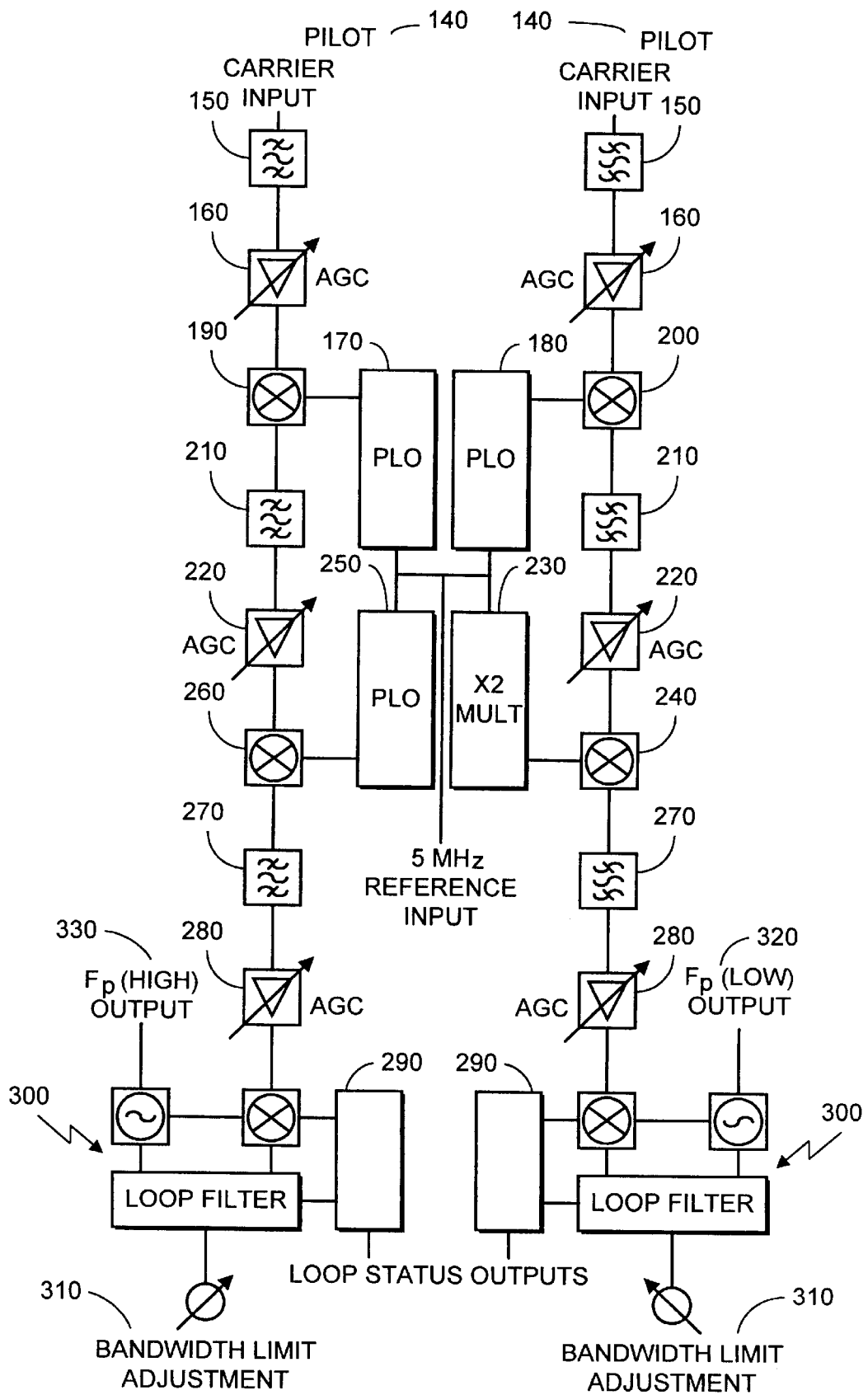
FIG. 3 is a circuit schematic diagram of a portion of an automatic frequency control system of the present invention.

A schematic circuit diagram of the input portion of the AFC controller is shown in FIG. 3. As described above, the ground station transmits two pilot frequencies 140 to determine the location/offset information. Pilot frequencies of 170.9 and 112.5 MHz are selected only for purposes of this description and are not critical to the invention. Preferably, these frequencies should be as widely separated as possible within the limitations of the system.

The incoming pilot frequencies are each band pass filtered 150 to remove carriers and noise which may be present at the image frequencies. The preferred pass band is as narrow as possible at the pilot frequency, but not less than the worst case expected Doppler frequency shift plus circuit drift, which in this case is not less than 200 KHz. The lower orbiting satellites will cause greater Doppler frequency shifts and thus wider bandwidths must be accommodated as well. AGC amplifiers 160 are used following the band pass filters 150 to avoid possible non-linear compression of the amplifiers. At this stage, the image frequencies for the first down conversion stage are both outside of the IF pass band. High side local oscillator frequency injection (at 170, 191.6 MHz in this example) is then applied 190 to the higher pilot carrier frequency while low side local oscillator frequency injection (at 180, 101.8 MHz in this example) is applied 200 to the lower pilot carrier frequency. This will cause a frequency sense reversal for the higher frequency pilot carrier which will be reversed again in the next down conversion stage.

A band pass filter 210 following the first mixer stage passes the desired carrier while rejecting the LO and image carriers produced by the mixing action. Both carriers in this example are now at approximately 10.7 MHz. An AGC amplifier 220 following this filter 210 provides gain while limiting the potential for amplifier overload. The pass band bandwidth of this filter 210 is limited to nominally 200 KHz.

The second down conversion stage restores the correct frequency sense for the lower pilot frequency by applying 240 low side local oscillator frequency injection (at 230, in this example, a 2×multiplier of the reference source 100 is used). High side local oscillator frequency injection (at 250, 11.4 MHz in this example) is applied 260 to the initially higher pilot carrier frequency. At the same time both pilot carrier frequencies are now at approximately 0.7 MHz. Both carriers are then preferably passed through band pass filters 270 and AGC amplifiers 280. A 0.7 MHz voltage controlled oscillator ("VCO") carrier is phase locked to each pilot carrier separately.

The loop networks 300 of the 0.7 MHz VCOs have adjustable time constants which are controlled by the pilot fault and search circuits 290. A phase lock loop such as that shown in U.S. Pat. No. 4,816,770 to the present inventor may be used. When the VCO frequencies are not locked to their respective incoming pilot frequencies, the loop filter time constants are adjusted to permit reasonably rapid frequency acquisition. When loss of phase lock occurs for more than 10 seconds, the fail circuits will be energized and the respective VCO will be placed in the search mode. In this mode, the VCO carrier frequency is adjusted in nominally 1 KHz increments from −100 KHz to +100 KHz of the nominal VCO center frequency. At the same time, the loop filter time constants are adjusted to permit rapid carrier acquisition. At each frequency step the frequency will be held for a period of 10 to 100 milliseconds. The time duration is a function of the loop time constant and the carrier detection process. The loop must first lock onto the unmodulated carrier. This can take up to several tens of milliseconds. A reduction in loop noise signals carrier detection. The reduction in noise can take an additional several milliseconds before reliable detection is sensed. If phase lock does not occur within that time period, the VCO frequency is incremented to the next frequency step. The VCO must step over 200 times to cover the entire frequency range of +/−100 KHz. Therefore, a single search period can take from 2 to 20 seconds, after which, if phase lock has still not been achieved, the search is repeated this time searching from +100 KHz to −100 KHz.

Once phase lock is achieved, the search mode is disabled and the loop filter time constants are adjusted to narrow the loop bandwidth of the phase lock loop. The loop bandwidth is preferably adjusted in increments of ⅓ to narrower bandwidths, although any increment will work similarly. The first preferred bandwidth position is nominally 1 KHz, the second 300 Hz, the next 100 Hz, etc. The narrowest bandwidth position is preferably on the order of 30 Hz, although 10 Hz and 3 Hz positions are provided. The operator can select the minimum loop bandwidth setting via remote or local control. The narrowest loop bandwidth setting is dependent upon the maximum Doppler slew rate expected for the carrier. Too narrow a setting will result in loss of phase lock at the highest Doppler slew rate of the satellite being tracked.

The phase lock loop essentially becomes a narrow band bandpass filter when the loop is in phase lock with the incoming carrier, which minimizes the phase and frequency jitter of the VCO carriers. The outputs of the separate VCOs 320, 330 are then applied to their respective frequency determining circuits (see FIG. 4).

Figure 4:
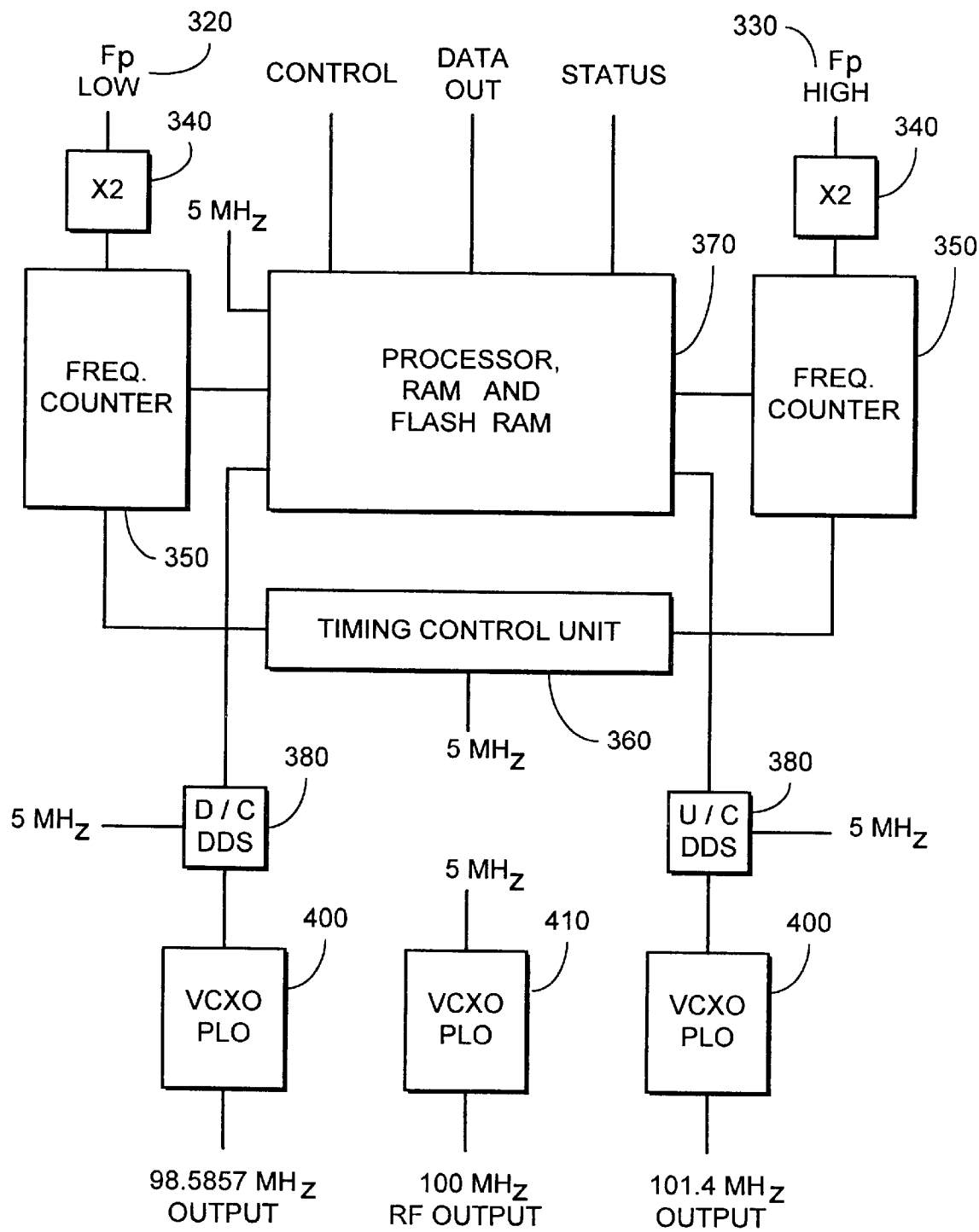
FIG. 4 is a circuit schematic diagram of another portion of an automatic frequency control system of the present invention.

Referring now to FIG. 4, the high and low pilot VCO frequencies 320, 330 from the AFC input circuits are each applied to a two times multiplier 340 before being applied to frequency counters 350. This effectively increases the frequency resolution of the frequency counters 350 by a factor of two. Thus, for a ten second count period, as described below, the +/−0.1 Hz frequency resolution of the counters is increased to +/−0.05 Hz.

A frequency counter 350 follows each of the multipliers, each counter preferably being an eight decade frequency counter. The frequency counters preferably have sufficient count capacity to accommodate the worst case satellite frequency offset and Doppler without error for count periods as long as 100 seconds. This long count period could provide the unit with a frequency resolution of +/−0.005 Hz, which is more than adequate for establishing the satellite frequency translation error. The least significant bits of the frequency counter will contain the necessary Doppler information. For example, a 100 second count period will mean that the least significant decade in the counter will provide resolution of 0.01 Hz. The 2×multiplier 340 increases the resolution to 0.005 Hz. A frequency counter is an ideal integrator that averages out the short term frequency variations over long count time periods.

The timing control unit 360 establishes the frequency counter 350 reset time interval and can be set locally or remotely for both the initial search and tracking modes of the counters 350. In the search mode, the processor 370 must establish the satellite frequency translation error based upon the measured differential frequency counted by the two frequency counters 350. This time period must be relatively long to provide sufficient accuracy for this variable. A minimum of a 10 second count interval is preferred for this purpose to provide the needed +/−0.05 Hz differential resolution for each frequency counter 350. In the tracking mode, the primary purpose of the frequency counters 350 is to establish the magnitude of the Doppler frequency offset and determine the Doppler frequency rate of change. For this purpose, a time interval of 1 second is preferred.

The AFC controller includes a processor 370, which preferably is a high speed processor, employing a 32 bit bus for data transfer to and from its memory, the direct digital synthesizers ("DDS") 380 of the Up and Down converters and the two frequency counters 350. Non-volatile flash RAM memory is used to save setup information in the event of power loss. Other RAM is used for intermediate calculation results and saving frequency information needed to control the frequency converter DDS units 380. The processor software is preferably written in the C programming language and compiled for rapid program execution. This program can be easily modified in the field to accommodate specific changes in the processor algorithms or programming when required. Integer arithmetic is preferably used for all calculations for efficient use of processor time. The frequency settings of the DDS units are updated every 1.0 to 3.0 milliseconds to avoid large frequency step changes which could result in an increase in modem Bit Error Rate (BER).

The processor 370 is essentially interrupt driven, the interrupts being generated by the timing control unit 360. Timing interrupts cause the processor 370 to enter specific subroutines for processing and updating the DDS units 380 or accepting inputs from the frequency counters 350 and calculating the new Doppler rate of change, for example. These last two interrupts have priority over all other processor functions except for a fault input 390 from the AFC unit input circuits which has the highest priority setting. Between interrupts, the processor 370 services requests for data from a controller and interface unit (not shown), or accepts commands from the controller and interface unit or front panel controls or updates the front panel displays (not shown).

As indicated earlier, the processor 370 has two primary operating modes—search mode and tracking mode. In addition, there are the display updating mode and the wait mode. In the wait mode, all primary functions have been satisfied and the processor can service the requests from external sources through the controller and interface unit.

The search mode of the processor can take one of two forms. The first is the initial search mode for which the satellite frequency translation error is not known and must be determined. This mode of operation has been previously described. The second search mode occurs during the tracking mode when loss of phase lock for one or both pilots occurs. Initially, a minor alarm state is initiated by the processor. In this state, the satellite translation frequency offset has already been established and need not be determined again. During this mode, the frequency converter DDS unit 380 frequencies are updated based upon the last known Doppler rates as stored in the nonvolatile flash RAM. After ten seconds without phase lock, a major alarm state is initiated by the processor 370 and the pilot receiver VCOs 300 are placed in the search mode. At this time the up converter transmissions may be muted if desired. When phase lock is again established with the pilot frequencies, the processor will immediately enter the tracking mode. When a new Doppler rate has been calculated, all alarm states will be terminated. The DDS 380 frequencies will be gradually changed to conform to the new calculated Doppler rates to avoid rapid frequency transitions which may result in an increase in modem BER. The preferred maximum frequency change rate is determined to minimize the phase error between the incoming carrier and the internal phase tracking loop of the modem resulting in maximum phase margin (minimum loop stress) and hence lower BER. Preferably, the frequency change per update is less than 1 Hz.

Voltage controlled crystal oscillator phase lock loops (VCXO PLO) 400 are locked to the DDS reference frequency. These loops serve to remove spurious frequencies generated by the DDS 380 and any D/A converters and to provide a low phase noise output carrier. The DDS frequencies are preferably selected to provide a low spurious carrier content close to the DDS output carrier frequency over the frequency range that they must operate.

A fixed 100 MHz VCXO PLO 410 serves as the reference local oscillator carrier frequency for the C-Band pilot down converters.

During the tracking mode of the processor, the measured high and low pilot frequencies are averaged, thus increasing the resolution of this measurement by a factor of 2:1. In addition, the resultant frequency will be the equivalent carrier frequency at the center of the satellite transponder bandwidth. Thus, no further corrections need be made to the result due to the pilot frequencies used.

While the embodiments shown and described are fully capable of achieving the objects and advantages of the invention, it is to be understood that the embodiments described herein are shown solely for the purposes of illustration and not for the purpose of limitation, the invention being only limited by the claims.

I claim:

1. In a system for communicating with an earth-orbiting satellite, including a plurality of user stations and a fixed hub communicating at a plurality of carrier frequencies which are subject to a Doppler shift with said satellite and with said plurality of user structures, said hub comprising:

means for receiving first and second pilot signals of different nominal frequencies from said satellite, the frequencies of said first and second pilot signals being shifted by different amounts due to the Doppler effect, first and second phase-locked loop each having a local oscillator;

means including means for comparing the Doppler shifts in said first and second pilot signals and for determining the shift in said pilot signals due to the Doppler effect; and processor means coupled to said comparing means and to said first and second phase locked loops for adjusting the frequency of said local oscillators in said first and second phase-locked loops, thereby to substantially cancel the Doppler effect frequency shifts in said carrier frequencies.

* * * * *